United States Patent
Katoh

(10) Patent No.: US 9,905,749 B2
(45) Date of Patent: Feb. 27, 2018

(54) PIEZOELECTRIC COMPOSITION AND PIEZOELECTRIC DEVICE

(71) Applicant: TDK CORPORATION, Tokyo (JP)

(72) Inventor: Hiroki Katoh, Tokyo (JP)

(73) Assignee: TDK CORPORATION, Tokyo (JP)

( * ) Notice: Subject to any disclaimer, the term of this patent is extended or adjusted under 35 U.S.C. 154(b) by 228 days.

(21) Appl. No.: 14/832,309

(22) Filed: Aug. 21, 2015

(65) Prior Publication Data

US 2016/0064644 A1     Mar. 3, 2016

(30) Foreign Application Priority Data

Aug. 29, 2014 (JP) ................................ 2014-175564

(51) Int. Cl.
| | | |
|---|---|---|
| *H01L 41/18* | (2006.01) | |
| *H01L 41/187* | (2006.01) | |
| *H01L 41/083* | (2006.01) | |

(52) U.S. Cl.
CPC ............ *H01L 41/18* (2013.01); *H01L 41/187* (2013.01); *H01L 41/083* (2013.01)

(58) Field of Classification Search
CPC ..... H01L 41/18; H01L 41/187; H01L 41/083; C04B 2235/3248; H01G 4/1227
USPC ................................................ 501/135–139
See application file for complete search history.

(56) References Cited

U.S. PATENT DOCUMENTS

| | | | | |
|---|---|---|---|---|
| 9,487,445 | B2* | 11/2016 | Natsui | ................ C01G 49/0036 |
| 2005/0109263 | A9* | 5/2005 | Chiang | ................ C01G 23/006 |
| | | | | 117/47 |
| 2008/0239627 | A1* | 10/2008 | Bridger | ................ C04B 35/462 |
| | | | | 361/321.5 |

FOREIGN PATENT DOCUMENTS

JP       2004-18321 A      1/2004

OTHER PUBLICATIONS

H.Y. Tian et al., "Diffusion phase transition and dielectric characteristics of Ba0.5Na0.5TiO3—Ba(Hf, Ti)O3 lead-free ceramics," Solid State Communications, vol. 142, pp. 10-14 , Apr. 2007.

Chao Zhou et al., "Triple-point-type morphotropic phase boundary based large piezoelectric Pb-free material-Ba (Ti0.8Hf0.2)O3—(Ba0.7Ca0.3)TiO3," Applied Physics Letters, vol. 100, pp. 1-5 , Jun. 2012.

\* cited by examiner

*Primary Examiner* — Matthew E Hoban
*Assistant Examiner* — Lynne Edmondson
(74) *Attorney, Agent, or Firm* — Oliff PLC

(57) ABSTRACT

The present invention aims to provide a piezoelectric composition which is free of lead based compounds and is represented by the following formula (1), $(Bi_{0.5x}Na_{0.5x}Ba_{0.7y+z}Ca_{0.3y})_a(Ti_{x+y+0.8z}Hf_{0.2z})O_3$ (1), wherein, x, y, z and a in formula (1) meets the following conditions, $0.70 \leq x \leq 0.90$, $0.02 \leq y \leq 0.28$, $0.02 \leq z \leq 0.28$, $0.90 \leq a \leq 1.10$ and $x+y+z=1$. The present invention also provides a piezoelectric device having the piezoelectric composition mentioned above.

2 Claims, 1 Drawing Sheet

PIEZOELECTRIC COMPOSITION AND PIEZOELECTRIC DEVICE

The present invention relates to a piezoelectric composition and a piezoelectric device widely used in the field of the inkjet head, the piezoelectric actuator, the film sensor or the like.

BACKGROUND

A piezoelectric device using a piezoelectric composition has an effect of generating a deformation when an external electric field is applied and also has an effect of generating electric charges on the surface when it receives an external stress. Recently, such a piezoelectric device is widely used in various fields. For example, a piezoelectric device which uses a lead based piezoelectric composition such as lead zirconate titanate and the like will deform in proportion to the applied electric voltage with the displacement value being a level of order of magnitude of $1 \times 10^{-10}$ m/V. Thus, such a piezoelectric device is excellent in fine position adjustment and can be further used for the fine adjustment in an optical system.

As a piezoelectric composition will generate electric charges in proportion to the applied stress or the deformation caused by the stress, it also can be employed as a sensor for detecting minute forces or deformation. Besides, a piezoelectric composition has an excellent responsiveness. Thus, when an alternating current field is applied, the piezoelectric composition itself or an elastomer coupled to the piezoelectric composition can be activated, leading to the occurrence of resonance. In this respect, the piezoelectric composition can also be used as a piezoelectric transformer, an ultrasonic motor or the like.

In general, a piezoelectric composition refers to a kind of substance obtained by providing a polarization treatment to a ferroelectric composition. The polarization treatment refers to a process in which a sintered ferroelectric composition with a random orientation for spontaneous polarization is applied with a direct electric field having an intensity above that of the coercive field of the sintered ferroelectric composition so as to bring the orientation of spontaneous polarization into a specific direction and to provide the ferroelectric composition with a polarity. Most of the ferroelectric composition with the spontaneous polarization and the piezoelectric compositions have a perovskite structure.

The compound with a perovskite structure generally refers to a compound represented by a formula of $ABO_3$. In particular, in such a structure, an alkali metal or an alkali earth metal having a big ionic radius is located in A site and a transition metal ion having a small ionic radius or the like is located in B site while the atom in A site is filled in the gaps in a three-dimensional network of $BO_6$ oxygen octahedral with their vertex being shared.

Now, the piezoelectric composition in application with more than a half having the perovskite structure is widely developed to meet various needs by adding various subcomponents or additives to a lead based piezoelectric composition composed of lead zirconate ($PbZrO_3$: PZ) and lead titanate ($PbTiO_3$: PT). For instance, there are various piezoelectric compositions such as a piezoelectric composition with a low mechanical quality factor (Qm) and a high piezoelectric constant ($d_{33}$) and a piezoelectric composition with a low piezoelectric constant ($d_{33}$) and a high mechanical quality factor (Qm). The previous one is used in an actuator or the like for position adjustment which seeks a big displacement via a direct current related method. The latter one is applicable to alternating-current related uses. For example, the latter one is used in an ultrasonic wave-generating device such as an ultrasonic motor.

There are substances other than PZT that can be used as a piezoelectric composition, most of which are substantially solid solutions using the lead based perovskite such as lead magnesio-niobate ($Pb(Mg_{1/3}Nb_{2/3})O_3$) as the main component.

However, these lead based piezoelectric compositions contain about 60 to 70 wt % of lead oxides having a low melting point and these lead oxides (PbO) is likely to volatilize during the firing process. Thus, if the influence on the environment is considered, less lead oxides is expected to be used. Besides, more and more lead based piezoelectric compositions are predicted to be used if the piezoelectric ceramics and the piezoelectric monocrystal are to be applied to more fields. Also, lead sulfate generated in the chemical reaction between the acid rain and lead are melted and precipitated in the soil, which may pose a threat to the ecosystem. In this respect, a piezoelectric composition free of lead has become an extremely important technical issue.

As a lead-free piezoelectric composition, for example, the barium titanate ($BaTiO_3$: BT), the bismuth layered ferroelectric and the like are well known. However, BT has a curie point (Tc) as low as 120° C. As the piezoelectric property will disappear at a temperature higher than 120° C., it can not be actually used if it is considered to be coupled by welding or used in vehicles. On the other hand, although the bismuth layered ferroelectric has a Tc as high as 400° C. or even higher and is excellent in thermal stability, the anisotropy of the crystal is high. Thus, it is difficult to provide $d_{33}$ as excellent as that of the lead based piezoelectric composition just through a normal ceramic related process. If an excellent $d_{33}$ is to be obtained, it will be necessary to make spontaneous polarization oriented through a hot-press method or a hot forging process. In this respect, a problem rises concerning the productivity.

Recently, the sodium bismuth titanate ($Bi_{0.5}Na_{0.5}TiO_3$: BNT) based composition can be presented as a new desired piezoelectric composition having a good $d_{33}$ and a Tc which is relatively high among the piezoelectric compositions without lead. For example, Reference 1 has disclosed a piezoelectric composition in which BT and calcium titanate ($CaTiO_3$: CT) are added into BNT.

PATENT DOCUMENT

Patent Document 1: JP-A-2004-18321

SUMMARY

However, the piezoelectric properties may be not sufficient or in particular $d_{33}$ may be not excellent in the piezoelectric composition disclosed in Patent Document 1 when compared to the lead based compositions even if Tc is kept at a relatively high level. Therefore, $d_{33}$ is requited to be further increased.

In this respect, the present invention provides an environment-friendly piezoelectric composition and an environment-friendly piezoelectric device having a relatively high Tc and an excellent $d_{33}$.

In order to solve the mentioned technical problems, the present inventors have found a BNT based composition exhibiting good piezoelectric properties as a piezoelectric composition.

The present invention is characterized in that the piezoelectric composition is free of lead based compounds and is represented by the following formula (1).

$$(Bi_{0.5x}Na_{0.5x}Ba_{0.7y+z}Ca_{0.3y})_a(Ti_{x+y+0.8z}Hf_{0.2z})O_3 \quad (1)$$

In formula (1), x, y, z and a adapt to the following inequations and equations.

$0.70 \leq x \leq 0.90$
$0.02 \leq y \leq 0.28$
$0.02 \leq z \leq 0.28$
$0.90 \leq a \leq 1.10$
$x+y+z=1$.

With the ranges mentioned above, a piezoelectric composition can be prepared to have both an excellent $d_{33}$ and a relatively high Tc.

Also, with respect to a piezoelectric device containing the piezoelectric composition such as an inkjet head, a piezoelectric actuator, a film sensor or the like, the piezoelectric device can provide a big displacement to an actuator or provide a high sensitivity to a sensor. Besides, a piezoelectric device being able to use in a wide temperature range can be provided because of the relatively high Tc it possesses.

According to the present invention, an environment-friendly piezoelectric composition and an environment-friendly piezoelectric device both having a relatively high Tc and an excellent $d_{33}$ can be provided.

DETAILED DESCRIPTION OF EMBODIMENTS

Figure 1:
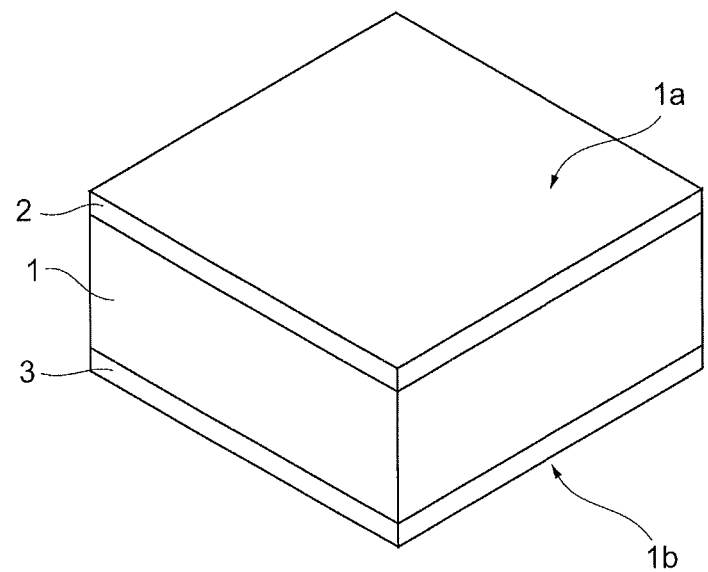
FIG. 1 is a perspective view showing one exemplary structure of a piezoelectric device using a piezoelectric composition in an embodiment of the present invention.

FIG. 1 is a perspective view showing one exemplary structure of a piezoelectric device using a piezoelectric composition in the present embodiment. The piezoelectric device is provided with a piezoelectric substrate 1 composed of the piezoelectric composition of the present embodiment and a pair of electrodes 2 and 3 respectively disposed on two opposing surfaces 1a and 1b of the piezoelectric substrate 1. The silver (Ag), palladium (Pd) and the like, for example, may be used as the electrodes 2 and 3.

Figure 2:
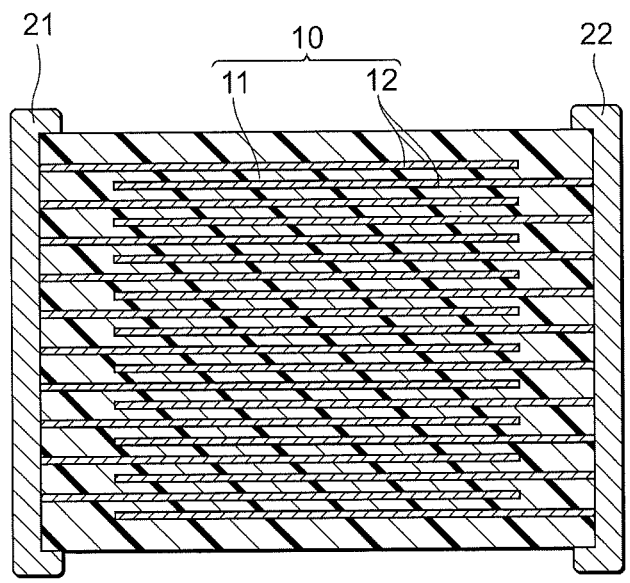
FIG. 2 is a sectional view showing another exemplary structure of a piezoelectric device using a piezoelectric composition in an embodiment of the present invention.

FIG. 2 is a sectional view showing another exemplary structure of a piezoelectric device using a piezoelectric composition in the present embodiment. The piezoelectric device is provided with a laminate 10 formed by alternatively stacking a plurality of piezoelectric layers 11 composed of the piezoelectric composition of the present embodiment and a plurality of internal electrodes 12. The silver (Ag), palladium (Pd) and the like, for example, can be used as the internal electrode 12.

The foregoing formula (1) can also be represented by the following formula (2), and the following formula (2) will be used in the description hereinafter for convenience.

$$x[(Bi_{0.5}Na_{0.5})_dTiO_3]+y[(Ba_{0.7}Ca_{0.3})_eTiO_3]+z[Ba_f(Ti_{0.8}Hf_{0.2})O_3] \quad (2)$$

In formula (2), x, y, z, d, e and f adapt to the following inequations and equations.

$0.70 \leq x \leq 0.90$
$0.02 \leq y \leq 0.28$
$0.02 \leq z \leq 0.28$
$0.90 \leq d \leq 1.10$
$0.90 \leq e \leq 1.10$.
$0.90 \leq f \leq 1.10$.
$x+y+z=1$.

According to formula (2), it can be seen that the piezoelectric composition of the present embodiment consists of BNT, barium calcium titanate ($Ba_{0.7}Ca_{0.3}TiO_3$: BCT) and barium hafnate titanate ($BaTi_{0.8}Hf_{0.2}O_3$: BHT).

In the three components, BNT is the main component, so the piezoelectric composition of the present embodiment has a relatively high Tc.

With respect to the three components mentioned above, the maximal value of residual polarization in the binary system of BNT and BHT is determined in a form of 0.90 BNT-0.10 BHT. The crystal system shows to be a rhombohedral system. As BHT is dissolved in BNT as a solid solute, the piezoelectric properties are predicted to become better.

In addition, in the three components, BCT shows a high reactive affinity to BNT so the presence of secondary phases will be prevented. Thus, it is easy to prepare a tri-component system of BNT-BCT-BHT. Besides, as BCT shows a tetragonal structure, an excellent $d_{33}$ will be provided by forming a morphotropic phase boundary (MPB) between the rhombohedral crystal (BNT-BHT) and the tetragonal crystal (BCT) represented by a formula mentioned above.

In other words, when MPB is present at the region where BNT with a relatively high Tc is used as the main component in the tri-component system mentioned above, a piezoelectric composition having a high Tc and an excellent $d_{33}$ can be provided.

Further, in addition to description of formula (2), it is preferable that x, y and z fall within the following ranges when the piezoelectric composition having BNT, BCT and BHT as the main components has a composition of $x[(Bi_{0.5}Na_{0.5})_dTiO_3]+y[(Ba_{0.7}Ca_{0.3})_eTiO_3]+z[Ba_f(Ti_{0.8}Hf_{0.2})O_3]$ to provide a relatively high Tc and a better $d_{33}$.

$0.80 \leq x \leq 0.95$
$0.10 \leq y \leq 0.13$
$0.02 \leq z \leq 0.10$

In formula (2), x ranges from 0.70 to 0.90. The Tc evidently decreases when x is smaller than 0.70 while $d_{33}$ is low due to a low residual polarization when x is larger than 0.90. In addition, y ranges from 0.02 to 0.28. The $d_{33}$ is low due to a low residual polarization when y is smaller than 0.02 while $d_{33}$ is also low when y is larger than 0.28 as the electrical resistivity is lowered and no sufficient polarization voltage can be applied. Besides, z ranges from 0.02 to 0.28. The $d_{33}$ is low due to a low residual polarization when z is smaller than 0.02 while $d_{33}$ is also low when z is larger than 0.28 as the electrical resistivity is lowered and no sufficient polarization voltage can be applied.

In formula (2), d preferably ranges from 0.90 to 1.10. The d represents the constituent ratio A/B of atoms in A site to those in B site in the compound having a perovskite structure in the whole piezoelectric composition. When d is larger than 1.10, it is not preferable as no good sintering property will be provided. If d is 1.10 or smaller, the sintering property will be enhanced. And it is preferable if d is 1.00 or smaller as better piezoelectric properties will be provided. However, d is preferred to be 0.90 or more and 1.10 or less as the piezoelectric properties will deteriorate if d is less than 0.90 as secondary phases without a perovskite structure will be generated.

In formula (2), e preferably ranges from 0.90 to 1.10. The e represents the constituent ratio A/B of atoms in A site to those in B site in the compound having a perovskite structure in the whole piezoelectric composition. When e is larger than 1.10, it is not preferable as no good sintering property will be provided. If e is 1.10 or smaller, the sintering property will be enhanced. And it is preferable if e is 1.00 or smaller as better piezoelectric properties will be provided. However, e is preferred to be 0.90 or more and 1.10 or less as the piezoelectric properties will deteriorate if e is less than 0.90 as secondary phases without a perovskite structure will be generated.

In formula (2), f preferably ranges from 0.90 to 1.10. The f represents the constituent ratio A/B of atoms in A site to those in B site in the compound having a perovskite structure in the whole piezoelectric composition. When f is larger than 1.10, it is not preferable as no good sintering property will be provided. If f is 1.10 or smaller, the sintering property will be enhanced. And it is preferable if f is 1.00 or smaller as better piezoelectric properties will be provided. However, f is preferred to be 0.90 or more and 1.10 or less as the piezoelectric properties will deteriorate if f is less than 0.90 as secondary phases without a perovskite structure will be generated.

If the piezoelectric composition of the present embodiment falls within the range of the composition represented by formula (2), the way to mix each component will not be limited. For example, the first component BNT, the second component BCT and the third component BHT are contained as the main components. In other words, the first component, the second component and the third component are contained and they are dissolved as solid solutes. Alternatively, they can be not completely dissolved as solid solutes.

The piezoelectric composition contains BNT and BCT and also BHT as the main components and may also contain at least one element as the subcomponent which is selected from the group consisting of the transition metal element (Group IB3 to Group IB11 in long-period form of the periodic table), the alkali metal element, the alkali earth metal element, the element from Group IIB12 and Group IIIA13 in long-period form of the periodic table. This is why Qm will increase. The main components here are those having a molar ratio of 90% or more relative to the total components which form the material composition.

In particular, chromium (Cr), manganese (Mn), iron (Fe), cobalt (Co), nickel (Ni), copper (Cu), tungsten (W) or molybdenum (Mo) can be listed as a transition metal element (except the rare earth element). If the contained subcomponent is a rare earth element, yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm) or ytterbium (Yb) can be listed.

If an alkali metal element is contained, then lithium (Li), potassium (K), rubidium (Rb) or cesium (Cs) will be provided. In addition, magnesium (Mg) or strontium (Sr) can be listed as an alkali earth metal element. If an element from Group IIB12 in the periodic table is contained, it can be zinc (Zn) or the like. If an element from Group IIIA13 is contained, it can be aluminum (Al), gallium (Ga), indium (In) or the like.

Further, the piezoelectric composition of the present embodiment may also contain lead as the impurity. However, the amount of lead is preferably 1 wt % or less. It is more preferable that no lead is contained at all. In this respect, the volatilization of lead during the sintering process or discharge of the lead into the environment after it is distributed in the market as a piezoelectric component and then abandoned can be inhibited to be a minimum. That is the reason why the amount of lead is preferred to be 1 wt % from the viewpoint of pollution, environment and ecology.

If the piezoelectric properties to exert or the mechanical strength is considered, the piezoelectric composition preferably has a particle size of 0.5 µm to 20 µm for the crystals.

The piezoelectric composition having such characteristics can be prepared as follows.

First of all, powders of bismuth oxide ($Bi_2O_3$), sodium carbonate ($Na_2CO_3$), titanium oxide ($TiO_2$), barium carbonate ($BaCO_3$), hafnium oxide ($HfO_2$), calcium carbonate ($CaCO_3$) and the like are prepared as the starting materials in accordance with needs, and then they were weighed in accordance with the target composition.

For the starting material, a substance such as the carbonate or the oxalate that turns to an oxide through a firing process can be used in stead of oxides.

Next, the well weighted starting materials are sufficiently mixed for 5 hours to 20 hours in an organic solvent or water by using, for example, a ball mill and so on. Thereafter, the mixture is sufficiently dried. The temperature in the drying process is, for instance, about 90° C. Such a drying process can be omitted if the starting material is mixed in a dry mixing manner.

The molded body of the dried starting material obtained by a press molding process or the powder itself is calcined for 1 hour to 20 hours at a temperature of 750° C. to 950° C. In particular, the rising rate and the decreasing rate of the temperature during the calcination process are set to be, for instance, about 50° C./hour to 300° C./hour. In addition, the calcination process in the present embodiment is done in air, and the partial pressure of oxygen is not particularly restricted.

A calcined article of the composition having a perovskite structure represented by the formula of $ABO_3$ can be prepared by the processes mentioned above. In the formula of $ABO_3$, A represents Bi, Na, Ba and Ca, and B represents Ti and Hf.

The calcined article is sufficiently pulverized in an organic solvent or water for 5 hours to 20 hours by a ball mill and then subjected to a drying process with the temperature being about, for instance, 90° C.

An organic binder solution (polyvinyl alcohol: PVA) is added to the dried calcined article to perform a granulation process. Then, the granulated powder after the granulation process is molded by an uniaxial pressing process to provide a circular cylinder, a rectangular column, a circular disk or an square plate.

It is preferable that a cold isostatic pressing (CIP) is further done after these mentioned processes. The isostatic pressing is preferably performed for 1 to 3 minutes with the maximal pressure being 1.0 to 3.5 MPa.

The molded body prepared by the mentioned processes is subjected to a thermal treatment for 2 hours to 4 hours at a temperature of 400° C. to 800° C. to remove the binder solution. Then, the temperature rises to 950° C. to 1300° C. to perform a firing process for 2 hours to 4 hours. The rising rate and the decreasing rate of the temperature during the firing process are set to be, for example, about 50° C./hour to 300° C./hour. The atmospheric gas in the firing process of the present embodiment is air and the partial pressure of oxygen is not particularly limited.

The crystal in the sintered body prepared by the processes mentioned above has an average particle size of 0.5 µm to 20 µm.

The sintered body obtained after the firing process is polished in accordance with actual needs, and electrodes are disposed. The electrode can be formed by coating a paste for electrodes and then sintering it. Alternatively, the electrode can be prepared by forming a film via a vapor deposition process or a sputtering process.

An electric field of 5 kV/mm to 10 kV/mm is applied to the sintered body (which prepared by the processes above) in a silicon oil at 25° C. to 200° C. so as to perform a polarization treatment for about 5 minutes to 1 hour. In this way, a piezoelectric composition is prepared by these processes.

FIG. 1 shows one exemplary structure of the piezoelectric device using the piezoelectric composition of the present embodiment. The piezoelectric device is provided with a piezoelectric substrate 1 composed of the piezoelectric composition of the present embodiment and a pair of electrodes respectively disposed on two opposing surfaces 1a and 1b of the piezoelectric substrate 1. The piezoelectric substrate 1 is polarized in the thickness direction (i.e., the direction in which the electrodes 2 and 3 are opposite to each other) and applies voltage through electrodes 2 and 3. In this way, a longitudinal oscillation occurs in the thickness direction.

The electrodes 2 and 3 are respectively composed of a metal such as gold (Au) or the like and disposed on the whole surface of each of the opposing surfaces 1a and 1b in the piezoelectric substrate 1. External power supplies not shown in the figures are electrically connected to the electrodes 2 and 3 via some lines also not shown in the figures.

Further, the piezoelectric device of the present embodiment can be prepared as follows. First of all, after the piezoelectric composition is prepared as mentioned above, the piezoelectric composition is processed to have a specified size in accordance with needs so as to form the piezoelectric substrate 1. Then, the electrodes 2 and 3 are formed on the piezoelectric substrate 1 by vapor deposition so as to prepare the piezoelectric device shown in FIG. 1.

Further, FIG. 2 shows another exemplary structure of the piezoelectric device using the piezoelectric composition of the present embodiment. The piezoelectric device is provided with a laminate 10 obtained by alternatively stacking a plurality of piezoelectric layer 11 composed of the piezoelectric composition of the present embodiment and a plurality of internal electrodes 12. The thickness of each layer is preferred to be 1 μm to 100 μm in the laminate 11, and the number of the piezoelectric layer 11 in use depends on the target displacement amount.

The internal electrode 12 contains some conductive material. The conductive material is not particularly restricted but preferred to be at least one selected from the group consisting of silver (Ag), gold (Au), platinum (Pt) and palladium (Pd) or the alloy thereof. In addition to the metal or the alloy, the internal electrode 12 may also contain various trace components such as phosphorus (P) in an amount of about 0.1 wt % or less. Then the thickness of the internal electrode 12 is preferably, for example, about 0.5 μm to 3 μm.

The internal electrodes 12 alternatively extend in opposite directions. In these mentioned directions, a pair of terminal electrodes 21 and 22 electrically connected to the internal electrodes 12 that are respectively disposed. The terminal electrodes 21 and 22 are those formed by, for example, sintering a paste for the terminal electrode. The paste for the terminal electrode contains, for instance, an inductive material, a glass frit and a vehicle. The conductive material contains, for example, at least one selected from the group consisting of Ag, Au, Cu, Ni, Pd and Pt. The vehicle can be an organic vehicle or a water-soluble vehicle or the like, wherein the organic vehicle is one obtained by dissolving the binder in an organic solvent, and the water-soluble vehicle is one obtained by dissolving a water-soluble binder, a dispersant and the like in water.

The piezoelectric device of the present embodiment can be prepared as follows. First of all, a pre-calcined powder is prepared by using the same method as that for preparing the piezoelectric composition mentioned above. Then, a vehicle is added to and mixed with the calcined powder to provide a paste for piezoelectric composition. In order to form an internal electrode 12, the mentioned conductive material or various oxides and organometallic compounds, which turn to conductive materials after fired, and the like are mixed with a vehicle so as to provide a past for internal electrode. Further, additives such as a dispersant, a plasticizer, a dielectric material, an insulating material or the like can be added to the paste for internal electrode if needed.

The paste for piezoelectric layer and the paste for internal electrode which are prepared by the processes above are used to prepare the green chip which is the precursor of the laminate 10 through a printing method or a sheet method. A treatment to remove the binder is provided to the green chip prepared by the processes above followed by a firing process to form the laminate 10.

The end surfaces of the laminate 10 obtained by the processes above are polished by a barreling process and a sand blasting process, and the paste for terminal electrode prepared by the same method as that for the paste for internal electrode is printed or transferred and then sintered to form the terminal electrodes 21 and 22. In this way, the piezoelectric device shown in FIG. 2 is prepared.

The piezoelectric composition of the present embodiment can be applied to a piezoelectric sound generator, a piezoelectric sensor, a piezoelectric actuator, a piezoelectric transformer, a film sensor, a film actuator or a piezoelectric ultrasonic motor. It is applicable to other components as long as they are piezoelectric devices capable of using the piezoelectric composition.

EXAMPLES

Hereinafter, the present invention will be further described based on the Examples and Comparative Examples. However, the present invention is not limited to the Examples.

Example 1 to Example 9

Powders of bismuth oxide ($Bi_2O_3$), sodium carbonate ($Na_2CO_3$), titanium oxide ($TiO_2$), barium carbonate ($BaCO_3$), hafnium oxide ($HfO_2$) and calcium carbonate ($CaCO_3$) were weighed in accordance with the ratios described in Table 1. The well weighed starting materials were mixed in a ball mill for 16 hours and then dried at a temperature of 120° C. The obtained mixed powder was subjected to a press molding process following by a pre-calcining process for 2 hours at a temperature of 800° C. so as to provide a pre-calcined body. Thereafter, the pre-calcined body was pulverized for 16 hours in a ball mill to provide the pulverized powder.

A binder was added to the pulverized powder obtained by the processes mentioned above to perform a granulation process. Then, a load of 3.2 MPa was applied to the granulated powder by a press molding machine to perform a press molding process so as to provide a tabular molded body. A thermal treatment was applied to the obtained tabular molded body at a temperature of 700° C. followed by a firing process done at a temperature of 1180° C. so that a sintered body was obtained. Further, the obtained sintered body was ground into plates parallel to each other with a thickness of 0.6 mm, and then two opposing electrodes made of silver was disposed via a vapor deposition method to both surfaces of the tabular sintered body arranged in parallel. At last, an electric field of 5 kV/mm was applied in a silicon oil at 50° C. to provide a polarization treatment for 15 minutes. In this way, the test pieces of Examples 1 to 8 for evaluation of piezoelectric properties that were listed in Table 1 were prepared by the processes mentioned above.

The $d_{33}$ and Tc of the piezoelectric composition were measured in the test pieces of Examples 1 to 8 (piezoelectric device) for evaluation of piezoelectric properties which were obtained by the processes mentioned above. The measurement of $d_{33}$ was done in the PIEZO $d_{33}$ METER MODEL: ZJ-4B (produced by Institute of Acoustic Sacademiasinica), and the measurement of Tc was done in the PRECISION LCR METER (produced by HEWLETT PACKARD). The obtained results were shown in Table 1.

were also measure in Comparative Examples 1 to 7 and the measurement results were shown in Table 1.

The symbols ○ and x were used to evaluate the piezoelectric properties of the piezoelectric compositions and the evaluation results were shown in Table 1. In the evaluation, $d_{33}$ was set to be 120 pC/N or more to keep the piezoelectric properties applicable and the temperature was set to be 200° C. to keep the piezoelectric properties applicable. Further, Tc was preferred to be 200° C. or higher. The piezoelectric composition was deemed suitable if all the conditions were met and the symbol ○ was provided. The piezoelectric composition was deemed not suitable if either or neither condition was met and the symbol x was provided.

As shown in Table 1, with respect to the piezoelectric composition of the present embodiment which was represented by formula (2) and contained three components of BNT, BCT and BHT as the main components, if x, y and z were respectively 0.70 or more and 0.90 or less, 0.02 or

TABLE 1

| | $(Bi_{0.5}Na_{0.5})TiO_3$ | | $(Ba_{0.7}Ca_{0.3})TiO_3$ | | $Ba(Ti_{0.8}Hf_{0.2})O_3$ | | | | Judgment |
|---|---|---|---|---|---|---|---|---|---|
| | Constituent ratio x | Ratio of A to B d | Constituent ratio y | Ratio of A to B e | Constituent ratio z | Ratio of A to B f | $d_{33}$ (pC/N) | Tc (° C.) | ($d_{33}$ ≥ 120 pC/N and Tc ≥ 200° C.) |
| Example 1 | 0.90 | 1.00 | 0.02 | 1.00 | 0.08 | 1.00 | 127 | 270 | o |
| Example 2 | 0.90 | 1.00 | 0.08 | 1.00 | 0.02 | 1.00 | 132 | 265 | o |
| Example 3 | 0.85 | 1.00 | 0.10 | 1.00 | 0.05 | 1.00 | 167 | 245 | o |
| Example 4 | 0.85 | 1.00 | 0.13 | 1.00 | 0.02 | 1.00 | 166 | 240 | o |
| Example 5 | 0.80 | 1.00 | 0.10 | 1.00 | 0.10 | 1.00 | 162 | 220 | o |
| Example 6 | 0.80 | 1.00 | 0.13 | 1.00 | 0.07 | 1.00 | 154 | 225 | o |
| Example 7 | 0.70 | 1.00 | 0.02 | 1.00 | 0.28 | 1.00 | 124 | 205 | o |
| Example 8 | 0.70 | 1.00 | 0.15 | 1.00 | 0.15 | 1.00 | 166 | 200 | o |
| Example 9 | 0.70 | 1.00 | 0.28 | 1.00 | 0.02 | 1.00 | 122 | 210 | o |
| Example 10 | 0.85 | 0.90 | 0.10 | 1.00 | 0.05 | 1.00 | 163 | 235 | o |
| Example 11 | 0.85 | 1.00 | 0.10 | 0.90 | 0.05 | 1.00 | 160 | 230 | o |
| Example 12 | 0.85 | 1.00 | 0.10 | 1.00 | 0.05 | 0.90 | 157 | 230 | o |
| Example 13 | 0.85 | 1.10 | 0.10 | 1.00 | 0.05 | 1.00 | 166 | 240 | o |
| Example 14 | 0.85 | 1.00 | 0.10 | 1.10 | 0.05 | 1.00 | 145 | 230 | o |
| Example 15 | 0.85 | 1.00 | 0.10 | 1.00 | 0.05 | 1.10 | 152 | 225 | o |
| Comparative Example 1 | 0.89 | 1.00 | 0.02 | 1.00 | 0.09 | 1.00 | 108 | 260 | x |
| Comparative Example 2 | 0.89 | 1.00 | 0.09 | 1.00 | 0.02 | 1.00 | 91 | 255 | x |
| Comparative Example 3 | 0.69 | 1.00 | 0.02 | 1.00 | 0.29 | 1.00 | 114 | 175 | x |
| Comparative Example 4 | 0.69 | 1.00 | 0.16 | 1.00 | 0.15 | 1.00 | 173 | 180 | x |
| Comparative Example 5 | 0.69 | 1.00 | 0.29 | 1.00 | 0.02 | 1.00 | 110 | 180 | x |
| Comparative Example 6 | 0.85 | 1.00 | 0.01 | 1.00 | 0.14 | 1.00 | 82 | 205 | x |
| Comparative Example 7 | 0.85 | 1.00 | 0.14 | 1.00 | 0.01 | 1.00 | 110 | 245 | x |
| Comparative Example 8 | 0.85 | 0.88 | 0.10 | 1.00 | 0.05 | 1.00 | unpolarizable | 235 | x |
| Comparative Example 9 | 0.85 | 1.00 | 0.10 | 0.88 | 0.05 | 1.00 | unpolarizable | 230 | x |
| Comparative Example 10 | 0.85 | 1.00 | 0.10 | 1.00 | 0.05 | 0.88 | unpolarizable | 230 | x |
| Comparative Example 11 | 0.85 | 1.12 | 0.10 | 1.00 | 0.05 | 1.00 | 68 | 320 | x |
| Comparative Example 12 | 0.85 | 1.00 | 0.10 | 1.12 | 0.05 | 1.00 | 32 | 85 | x |
| Comparative Example 13 | 0.85 | 1.00 | 0.10 | 1.00 | 0.05 | 1.12 | 24 | 95 | x |

Comparative Examples 1 to 7

In Comparative Examples 1 to 7, the piezoelectric compositions were prepared as in Example 1 except that the constituent ratios (x, y and z) of the starting materials were changed in accordance with Table 1. Further, $d_{33}$ and Tc more and 0.28 or less, and 0.02 or more and 0.28 or less, $d_{33}$ and Tc among the piezoelectric properties were particularly good.

Beside what had been described above, it was more preferable that x, y and z were respectively 0.80 or more and 0.85 or less, 0.10 or more and 0.13 or less, and 0.02 or more and 0.10 or less in the piezoelectric composition of the present embodiment which was represented by formula (2) and contained three components of BNT, BCT and BHT as the main components because a relatively high Tc and an excellent $d_{33}$ would be provided.

In addition, with respect to the piezoelectric composition of the present embodiment, Tc significantly decreased as the ratio of BCT-BHT increased. This was because the Tc of BCT or BHT itself was low. The present invention was characterized in that a piezoelectric composition also with excellent $d_{33}$ can be prepared by using the morphotropic phase boundary of BCT or BHT or both in BNT having a relatively high Tc.

Examples 10 to 15

Piezoelectric compositions in Examples 10 to 15 were prepared as in Example 1 except that x, y and z were respectively set to be 0.85, 0.10 and 0.05 and the constituent ratio of the starting materials were changed in accordance with the levels of d, e and f as shown in Table 1. Further, $d_{33}$ and Tc were similarly measured in Examples 10 to 15, and the measurement results were shown in Table 1.

It can be known from Table 1 that it was good when $0.90 \leq d \leq 1.10$, $0.90 \leq e \leq 1.10$ and $0.90 \leq f \leq 1.10$. Thus, the piezoelectric composition of the present embodiment was characterized in that the sintering property was improved since the composition was difficultly affected by the secondary phases generated due to the difference of stoichiometric ratio.

Comparative Examples 8 to 13

Piezoelectric compositions in Comparative Examples 8 to 13 were prepared as in Example 1 except that x, y and z were respectively set to be 0.85, 0.10 and 0.05 and the constituent ratio of the starting materials were changed in accordance with the levels of d, e and f as shown in Table 1. Further, $d_{33}$ and Tc were similarly measured in Comparative Examples 8 to 13, and the measurement results were shown in Table 1.

In Comparative Examples 8 to 10, the electric resistivity significantly decreased as secondary phases appeared evidently. Thus, the insulating property was destroyed in the polarization treatment so that $d_{33}$ could not be measured. On the other hand, in Comparative Examples 11 to 13, as secondary phases appeared evidently, the morphotropic phase boundary could not be maintained and no excellent $d_{33}$ can be obtained.

The present invention has been described by providing the embodiments and examples above, but the present invention is not limited thereto. In the embodiments and examples described above, only the cases where all of BNT, BCT and BHT were contained have been described. However, the piezoelectric composition or the piezoelectric device containing other compounds besides BNT, BCT and BHT will also fall within the scope of the present invention.

With respect to a piezoelectric device containing the piezoelectric composition of the present invention such as an inkjet head, a piezoelectric actuator, a piezoelectric actuator, a film sensor or the like, a big displacement can be provided to an actuator or a high sensitivity can be provided to a sensor. Besides, a piezoelectric device with a wide temperature range where it can be used can be provided because of the relatively high Tc the piezoelectric composition possesses.

DESCRIPTION OF REFERENCE NUMERALS

1 Piezoelectric substrate
2, 3 Electrode
1a, 1b Opposing surfaces
10 Laminate
11 Piezoelectric layer
12 Internal electrode
21, 22 Terminal electrode

What is claimed is:

1. A piezoelectric composition which is free of lead based compounds and is represented by the following formula (1),

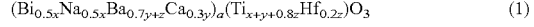

$$(Bi_{0.5x}Na_{0.5x}Ba_{0.7y+z}Ca_{0.3y})_a(Ti_{x+y+0.8z}Hf_{0.2z})O_3 \quad (1)$$

x, y, z and a in formula (1) meeting the following conditions,
$0.80 \leq x \leq 0.85$,
$0.10 \leq y \leq 0.13$,
$0.02 \leq z \leq 0.10$,
$0.90 \leq a \leq 1.10$,
$x+y+z=1$.

2. A piezoelectric device comprising the piezoelectric composition of claim 1.

* * * * *